Nov. 14, 1967 R. L. LUCE 3,352,726

METHOD OF FABRICATING PLANAR SEMICONDUCTOR DEVICES

Filed April 13, 1964

INVENTOR.
ROBERT L. LUCE
BY
ATTORNEY 3,352,726
Patented Nov. 14, 1967

3,352,726
METHOD OF FABRICATING PLANAR SEMICONDUCTOR DEVICES

Robert L. Luce, Harleysville, Pa., assignor to Philco-Ford Corporation, a corporation of Delaware
Filed Apr. 13, 1964, Ser. No. 359,159
2 Claims. (Cl. 148—187)

This invention relates to the semiconductor art and more particularly to a novel and simplified method of fabricating integrated planar semiconductor devices, and to devices produced by the practice of such method.

The phrase "integrated planar semiconductor device" and variations of that expression, as used in the specification and claims, refers to a semiconductor component generated in a common substrate and comprising a composite of individual semiconductor devices such, for example, as the dual planar transistors illustrated in FIGURE 4 of the drawing.

The invention while of broader applicability has particularly advantageous use in the construction of integrated dual transistor devices such, for example, as those having potential use in switching, or chopper applications.

It is the present practice in constructing integrated transistor devices to epitax onto a semiconductive substrate a collector region of desired resistivity. The dual emitters of the system and common base structure are then generated within the epitaxial region by a two-step diffusion process. The structure produced by this prior art process is shown in FIGURE 2. While this procedure has produced a usable device, the process is both more complicated and expensive than that contemplated by the instant invention. Moreover, it is possible, using the simpler process of my invention, to produce semiconductor devices of superior performance characteristics.

In those instances in which an integrated pair of transistors is destined for use as a chopper, practice of the invention has resulted in a structure whose operating characteristics are particularly advantageous. A chopper device, as the name indicates, is a device designed to interrupt electrical signals by switching from an open circuit to a closed circuit in synchronization with an external drive signal. Such devices find wide current application in the transmission of information from and to space vehicles and ballistic missiles. They are also used to gate many sources of electrical information so that they may be handled by a single telemetry transmitter. They are also used extensively in computer and industrial control devices to convert small direct current signals into an easily amplified alternating current.

Accordingly, it is a general object of the invention to provide a process for fabricating multi-junction semiconductor devices generally, and integrated dual emitter transistors specifically, which overcomes the deficiencies and limitations of the prior art.

It is a further object of the invention to provide a process for fabricating integrated planar semiconductor devices which results both in reduction in their manufacturing costs and in simplification of the over-all process.

A still further object of the invention is the provision of an inexpensive method of mass producing integrated, planar, dual transistor devices of superior performance characteristics.

Another object of the invention is the provision of a single-step diffusion process for generating such devices.

These and other objects and features of the invention will be apparent from a consideration of the following detailed description taken in conjunction with the accompanying drawing, in which.

In achievement of the foregoing and other objectives, the invention contemplates the novel application of planar technology to the fabrication of a uniquely structured semiconductor device.

It is the practice of the prior art to control generation of junctions in a direction normal to the surface exposed to the diffusant. This approach, which has become the accepted mode of constructing planar semiconductor devices, presents complications which practice of the instant invention avoids.

Applicant's process, in contradistinction to the prior art, teaches control of junction generation in a direction transverse the normal drawn to the surface, and the production of a plurality of coplanarly disposed diffused zones. By modifying the direction in which the generative process is carried out and by resort to a coplanar arrangement of active regions of the device, unexpected and unobvious advantages result.

Figure 1:
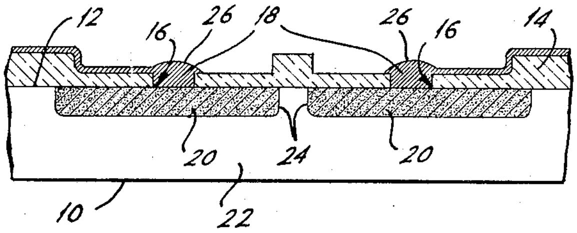
FIGURE 1 is an elevational view, in section, of a semiconductor device fabricated by practice of the method teachings of the instant invention.

Briefly outlined, referring to FIGURE 1, the method aspects of the instant invention, as practiced, for example, in the fabrication of a simple planar transistor device, consist of using a grown or epitaxially formed monocrystalline wafer 10 of semiconductive material of given conductivity type suitable for transistor bases. This permits the construction of a base material of substantially homogeneous composition. On surface portions 12 of this wafer is grown an oxide overlay 14. Windows 16 are then cut through the overlay, in juxtaposed pairs 18, and a diffusion step is employed to generate within the exposed semiconductive material, regions 20 of conductivity type opposite that of the base material 22. In particular accordance with the invention, the confronting surface portions 24 of these diffused regions are generated in sufficiently close proximity to permit transistor action therebetween. This results in the formation of a transistor of new structural form comprising coplanar regions of one conductivity type separated by a thin, homogeneous, base region of opposite conductivity type. The confronting surface portions 24 of the diffused zones form the active junctions of the device, the substrate 10 in which the junctions are generated, forming the base.

Contacts 26 are next applied by conventional photolithographic procedures completing the device. It will be seen that by generating the junctions in side-by-side, coplanar relationship rather than in conventional overlying relationship, and by controlling the extent of lateral diffusion, the process of fabricating planar transistor devices undergoes substantial simplification.

Devices fabricated in this manner may be made either unilateral or bilateral, permitting, in the latter instance, the emitter and collector regions to be used interchangeably. Unilateral devices may be constructed by differentially controlling the diffusion rate as between regions destined to become emitters and those destined to become collectors. One technique, for example, would be to leave a thin residue of oxide in the oxide cut defining the collector diffusion region. The oxide residue has the effect of retarding the diffusion process so that the collector regions are less heavily doped than the emitter regions. Since only one diffusion step is employed, the process is considerably less expensive than conventional planar fabricating procedures while at the same time retaining the benefits of the planar process.

Figure 2:
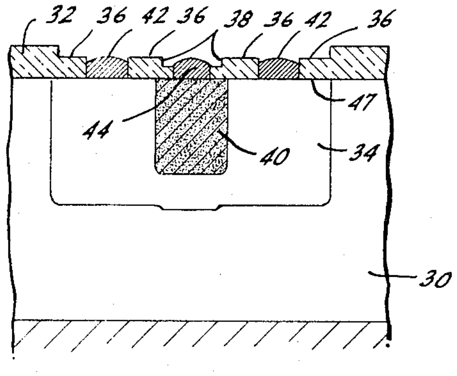
FIG. 2. (PRIOR ART)
FIGURE 2 is a sectional elevational view of a semiconductor device fabricated by use of prior art techniques.

In apposition to the simplified process described, the prior art method of fabricating such a device is to start with a suitable wafer 30, (FIGURE 2) of monocrystalline material, on which there is thermally grown an oxide overlay 32. Next a photosensitive resist material such, for example, as Kodak Photo Resist (KPR) is applied over the oxide and the surface is selectively exposed through a suitable photomask to define a plurality of individual base diffusion areas. The wafer is then chemically processed to remove the unexposed resist material and the oxide thus exposed removed by an acid etch, using, for example, hydrofluoric acid. This step is followed by a base diffusion using an appropriate dopant during which time the base region 34 is generated. For purposes of illustration the vertical dimensions of the device have been greatly exaggerated. As will be appreciated, diffusion generation of the base region, in contradistinction to the homogeneous composition of the base material resulting from practice of my invention, results in a base region having a graded composition of dopant. Oxide 36 is regrown over the base region during diffusion. The emitter area opening 38 is then defined by a second photomasking and etching process similar to that just described. The emitter diffusion is carried out using a dopant capable of producing a region 40 of conductivity type opposite that produced by the preceding diffusion step. A third photomasking-etching operation is employed to define the contact geometry after which aluminum, or other suitable contact material, is evaporated over the wafer to provide the base and emitter connections 42 and 44. Following this multi-step procedure, the wafer may be scribe cut or isolation diffused into individual transistor devices.

The described prior art process requires the use of a plurality of high precision photomasks and two separate diffusion steps. Not only are masks difficult and expensive to make but each must be placed in accurate registration with the pattern laid down by the previous mask in order to produce a satisfactory end product. The problem of avoiding accumulation of error in such a process is both difficult and expensive and one whose difficulty is directly proportional to the number of patterns required for reproduction. This problem is particularly aggravated by the greater emphasis on miniaturization.

In contrast to the multistep prior art procedures, the instant invention allows formation of a transistor structure by a single diffusion step characterized by a coplanar disposition of active regions of the device. It has been found that by controlling lateral diffusion of an appropriate dopant through juxtaposed openings in a single diffusion mask, the emitter and collector regions may be generated concurrently. Since only one diffusion step is employed, the process is considerably simpler and less expensive than conventional methods of fabrication.

Figure 3:
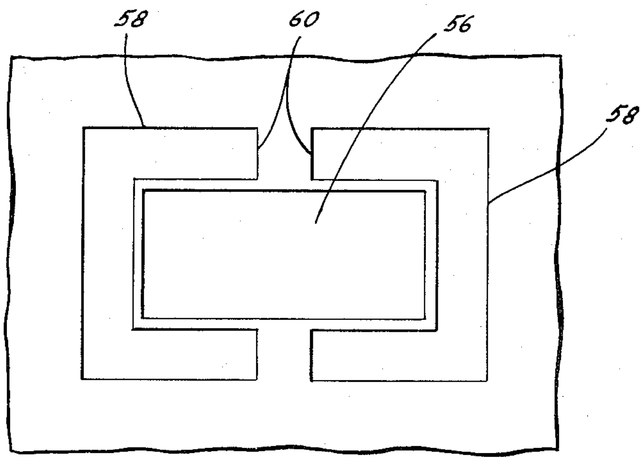
FIGURE 3 is a plan view of a device undergoing fabrication by the process of this invention showing one geometry of oxide cuts used in junction generation.
Figure 4:
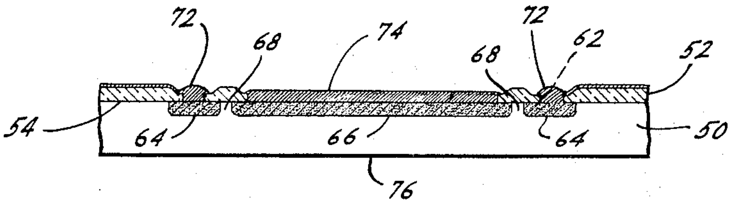
FIGURE 4 is a sectional elevational view of a device constructed by practice of the method steps of the invention.

A particularly advantageous application of the invention has been its use in the fabrication of an integrated pair of transistor devices of the type, for example, illustrated in FIGURE 4, the diffused regions of which have the general configuration outlined in FIGURE 3.

By modifying the disposition of the active regions of the device, while at the same time retaining the basic advantages of the planar process, an integrated dual transistor device having particular advantageous use in chopper applications has been devised. This device while having performance characteristics competitive with prior art devices is capable of fabrication by a simpler, less expensive process.

Examplary of the method concepts of the instant invention is the folowing fabricating procedure. An important feature of the invention, as previously noted, is that of utilizing the substrate material 50 (FIGURE 4), in which the diffusion is to be carried out, as the base structure of the unit. Typically, the substrate may consist of a grown monocrystalline slab of homogeneous N or P type semiconductive material having a resistivity of approximately .05 ohm-centimeters. Beginning, for example, with a homogeneous P-type silicon substrate of prescribed resistivity, an oxide overlay 52 is thermally grown on selected surface portions 54 thereof. This step may be carried out in a quartz-tube diffusion furnace maintained at 1200° C. The wafer, an attainment of thermal equilibrium, is flooded with wet oxygen for a period sufficient to produce an oxide coating approximately 11,000 A. thick.

Next, a plurality of emitter and collector openings are simultaneously made in the oxide overlay using a single mask, employing conventional photo-engraving techniques. Typically, the openings are generated, in groupings of several hundred or more, in a single wafer measuring approximately ¾ to 1 inch in diameter. One set of such openings is shown in FIGURE 3.

To a first approximation diffusion is controlled by the geometry of the oxide openings. An illustrative arrangement of one geometry of openings is shown in FIGURE 3 and comprises a central rectangular opening 56 flanked by C-shaped cuts 58 interdigitated therewith. The central opening defines the collector region of the device and the C-shaped cuts define the dual emitters. Typically, the collector cut 50 may be 5.6 mils in length by 2.6 mils in width spaced from the emitter cuts by a .2 mil separation. In the embodiment illustrated, the confronting ends 60 of the C-shaped openings are spaced one mil apart.

With this pattern of oxide openings cut into the face of the wafer, it is placed in the furnace along with an N-type diffusion charge comprising, by way of example, an admixture of phosphorus pentoxide and silicon dioxide. The partial pressure of phosphorus pentoxide at a given temperature, and accordingly its availability within the diffusion chamber as a dopant material is controlled by modifying its solution concentration.

Using an admixture of ten mole percent $P_2O_5$ in $SiO_2$ in an oven maintained at a temperature of about 1080° C. the wafer was exposed for 12 minutes to obtain the desired deposition of phosphorus in the emitter and collector cuts. The phosphorous pentoxide is reduced, during deposition, to elemental phosphorus on contact with the exposed silicon.

The deposition phase of the process is followed by redistribution, or drive-in, of the deposited phosphorus. Any phosphorus glass formed during the deposition phase is removed prior to redistribution by use of buffered hydrofluoric acid. Redistribution is carried out in dry oxygen for approximately 4 hours and 45 minutes at a temperature of 1080° C. The diffusion depth normal to the surface resulting from the above outlined procedure was about .08 mil. The lateral penetration of diffusant under these circumstances was found to be approximately equal to the diffusion depth normal to the surface.

Contact cuts 62 are next made in the oxide overlay thermally regrown during the drive-in stage of the process, to provide electrical access to emitter and collector regions 64 and 66 respectively. The contact cuts are contained within the original cuts 56 and 58 by a 0.25 mil spacing on all sides.

To insure good ohmic connection between P-type contact material such as aluminum and the N-type diffused regions 64 and 66 the oxide-denuded regions are preferably rediffused with phosphorus for approximately seven minutes at 1080° C. to increase the surface concentration of impurity. This step, while desirable, is not indispensible to the practice of the invention. Since the aluminum forms a P-type impurity in silicon, there is a tendency when alloying aluminum to an N-type layer to form a P-type recrystallized layer immediately under the contact thereby introducing an unwanted rectifying barrier region. Any oxide regrown during this phase of the process is removed by buffered HF. Aluminum is vacuum deposited over the entire surface of the device to a thickness of approximately 8000 A., following which metal is backetched by known photoengraving techniques to produce the desired contact configuration.

The resulting contacts 72 and 74 are shown in FIGURE 4. After the contacts have been deposited, the structure may be heated to alloy the metal-silicon interface to insure good ohmic connection. To permit electrical contact to be made to the base region 50, a thin metal coating is provided at 76 on the back side of the silicon body.

The described fabricating procedure resulted in a base width separation 68 between diffused regions 64 and 66, and between confronting ends of the C-shaped diffused regions, whose shape corresponds generally to the configuration shown in FIGURE 3, of approximately 0.04 mil and 0.86 mil respectively. This base width spacing was found to provide satisfactory transistor action. As previously noted, the amount of $P_2O_5$ initially deposited on the silicon surface is a primary factor in determining the extent of lateral diffusion.

By employment of the method teachings of the instant invention, an illustrative application of which has been described, semiconductor devices may be constructed more simply and inexpensively. Additionally, dual emitter semi-conductor devices, such for example, as the integrated dual transistor shown, exhibit chopper performance characteristics which are either superior or competitive with prior art devices.

Specifically, there are three principal parameters which are of paramount interest in a transistor chopper. These are emitter-to-emitter break-down voltage, differential off-set voltage, measured when the device is operative, and the dynamic series resistance between emitters during device operation. As to the first of these, devices fabricated by the procedure outlined have exhibited an emitter-to-emitter break-down voltage of 15 volts. This parameter may be made considerably higher and in fact is one of the important features of the invention since higher break-down voltages can be achieved between emitters separated by a base width whose impurity composition is homogeneous as is the case with devices made by practice of the instant invention, than in constructions in which the emitters are separated by a base width of graded impurity composition, as is typical of devices made by prior art methods. By raising the base resistivity, significantly higher break-down voltages could be obtained width the limiting factor being the punch-through voltage which can be tolerated between emitters.

When using dual transistors in the porformance of a chopping function, a high degree of electrical symmetry is required between the two transistors. Even with the best manufacturing control and precision a tedious matching of electrical characteristic is required for the transistors to operate with minimum error i.e. off-set voltage. Not only must the units match at room temperature, but they must match over the extremes of temperature to which the electronic equipment is exposed.

This parameter, while not improved over dual emitter prior art devices remains competitive therewith by reason of the near perfect symmetry of the structural form which results from practice of the instant invention. A representative value of this parameter, as measured on a device having the constructional features shown in FIGURES 3 and 4 of the drawing, is 260 $\mu$v. at a base current of 2.0 ma.

In conventional devices, the third parameter of significance, that of dynamic series resistance, is correlated with the inverse beta of the device. In contrast, the dynamic series resistance of devices made by the practice of this invention are directly and linearly related to the emitter-to-emitter forward current gain. Extrapolation of experimental data taken from a limited sampling indicates that dual emitter semiconductor devices, fabricated in accordance with the method teachings of the invention, and having the constructional arrangement shown, can be made to have zero dynamic series resistance when constructed with a beta of 0.23.

While preferred practice, illustrative of the method and apparatus aspects of the present invention, have been depicted and described it will be understood by those skilled in the art that the invention is susceptible to changes and modifications without departing from the essential concepts thereof and, that such changes and modifications are contemplated as come within the scope of the appended claims.

I claim:

1. The method of constructing an integrated, composite transistor device, which comprises:

(a) providing openings in a masking oxide layer on the surface of a body of semiconductive material of given conductivity type;

(b) simultaneously diffusion-generating in said body through use of said openings a coplanar grouping of closely spaced regions of conductivity type opposite that of said body, which grouping, as viewed in the plane of the diffusant-exposed surface of said device, comprises a central region of generally rectangular configuration, disposed in interdigitating relation with opposed C-shaped regions;

(c) limiting the time of said diffusion to control the lateral spread of said diffusant to define zones of such adjacency as to permit transistor action therebetween; and (d) making electrical connection to said two C-shaped regions and to said central region respectively to permit their operation as the dual emitters and common collector of said integrated device.

2. The method of claim 1 in which said semiconductive material is silicon and in which said C-shaped regions are spaced from said central region by a distance of approximately two tenths of a mil and the confronting ends of said C-shaped openings are spaced one mil apart.

References Cited

UNITED STATES PATENTS

| | | | |
|---|---|---|---|
| 2,721,965 | 10/1955 | Hall | 148—33 X |
| 2,944,321 | 7/1960 | Westberg | 148—335 X |
| 3,005,937 | 10/1961 | Wallmark | 148—186 X |
| 3,070,466 | 12/1962 | Lyons | 148—187 X |
| 3,117,260 | 1/1964 | Noyce | 148—33 X |
| 3,144,366 | 8/1964 | Rideout | 148—87 X |
| 3,183,128 | 11/1965 | Leistiko | 148—187 X |
| 3,188,251 | 6/1965 | Straight | 148—179 |
| 3,200,019 | 11/1965 | Scott | 148—187 |
| 3,223,904 | 12/1965 | Warner | 317—235 |

HYLAND BIZOT, *Primary Examiner.*